United States Patent
Wai Li et al.

(10) Patent No.: US 12,230,937 B2
(45) Date of Patent: Feb. 18, 2025

(54) HEADER FOR AN ELECTRIC COMPONENT

(71) Applicant: SCHOTT AG, Mainz (DE)

(72) Inventors: Ong Wai Li, Johor Bahru (MY); Jian Dean Tan, Singapore (SG); Amy Soon Li Ping, Singapore (SG); Andreas Krause, Vilsheim (DE); Artit Aowudomsuk, Bangkok (TH); Karsten Droegemueller, Eichenau (DE)

(73) Assignee: SCHOTT AG, Mainz (DE)

( * ) Notice: Subject to any disclaimer, the term of this patent is extended or adjusted under 35 U.S.C. 154(b) by 750 days.

(21) Appl. No.: 17/461,663

(22) Filed: Aug. 30, 2021

(65) Prior Publication Data

US 2022/0069543 A1 Mar. 3, 2022

(30) Foreign Application Priority Data

Sep. 3, 2020 (EP) .................................. 20 194 345

(51) Int. Cl.
  *H01S 5/02212* (2021.01)
  *H01S 5/02345* (2021.01)
  *H01S 5/024* (2006.01)

(52) U.S. Cl.
  CPC ...... *H01S 5/02212* (2013.01); *H01S 5/02345* (2021.01); *H01S 5/02415* (2013.01); *H01S 5/02476* (2013.01); *H01L 2924/12042* (2013.01)

(58) Field of Classification Search
  None
  See application file for complete search history.

(56) References Cited

U.S. PATENT DOCUMENTS

| | | |
|---|---|---|
| 5,812,582 A | 9/1998 | Gilliland |
| 6,506,624 B2 | 1/2003 | Tatoh |
| 6,587,491 B1 | 7/2003 | Yamamoto |
| 6,803,520 B1 | 10/2004 | Musk |
| 11,973,311 B2 * | 4/2024 | Wang ..................... H01S 5/0235 |
| 2002/0121863 A1 | 9/2002 | Morishita |
| 2002/0131460 A1 | 9/2002 | Chen |

(Continued)

FOREIGN PATENT DOCUMENTS

| | | |
|---|---|---|
| CN | 1573387 | 2/2005 |
| CN | 103907249 | 7/2014 |

(Continued)

OTHER PUBLICATIONS

Baek, "High Sensitive 10-GB/s APD Optical Receivers in Low-Cost TO-Can-Type Packages", IEEE Photonics Technology Letters, vol. 17, No. 1, Jan. 2005.

*Primary Examiner* — Tuan N Nguyen
(74) *Attorney, Agent, or Firm* — Ruggiero McAllister & McMahon LLC

(57) ABSTRACT

A header for electronic components is provided. The header has a base with at least two electrical feedthroughs each having a feedthrough pin extending through the base and being electrically isolated to the base within the feedthrough. The further includes at least one pedestal connected to the base and two submounts. Each submount includes a carrier with a structured conductor plating that has at least two conductor traces with one of the conductor traces of each submount being electrically connected to one of the feedthrough pins. The submounts are equally formed but mounted in different orientations.

16 Claims, 7 Drawing Sheets

(56) References Cited

U.S. PATENT DOCUMENTS

| | | |
|---|---|---|
| 2003/0165167 A1 | 9/2003 | Ichikawa |
| 2004/0144554 A1 | 7/2004 | Reznik |
| 2004/0247004 A1 | 12/2004 | Keh |
| 2005/0089070 A1 | 4/2005 | Honda |
| 2005/0121684 A1 | 6/2005 | Aruga |
| 2005/0232322 A1 | 10/2005 | Bessho |
| 2006/0176918 A1* | 8/2006 | Aruga ............... H01S 5/02345 372/38.1 |
| 2006/0198600 A1 | 9/2006 | Oomori |
| 2006/0251138 A1 | 11/2006 | Hata |
| 2006/0281202 A1 | 12/2006 | Ishida |
| 2007/0228535 A1 | 10/2007 | Fujino |
| 2008/0118251 A1 | 5/2008 | Itamoto |
| 2008/0245545 A1 | 10/2008 | Bjorn |
| 2009/0067469 A1 | 3/2009 | Sato |
| 2011/0235980 A1 | 9/2011 | Sato |
| 2014/0241388 A1 | 8/2014 | Yamanaka |
| 2018/0145003 A1 | 5/2018 | Shirasaki |
| 2019/0036298 A1 | 1/2019 | Fujimura |
| 2019/0074658 A1* | 3/2019 | Jungwirth ........... H01S 5/02325 |
| 2020/0067265 A1 | 2/2020 | Hettler |
| 2020/0192038 A1 | 6/2020 | Noguchi |
| 2020/0203922 A1 | 6/2020 | Zhang |
| 2020/0243992 A1 | 7/2020 | Annequin |
| 2021/0057878 A1 | 2/2021 | Oomori |
| 2021/0305472 A1 | 9/2021 | Kimura |

FOREIGN PATENT DOCUMENTS

| | | |
|---|---|---|
| CN | 107508141 | 12/2017 |
| CN | 108075350 | 5/2018 |
| CN | 108988120 | 12/2018 |
| CN | 110808491 | 2/2020 |
| CN | 111509501 | 8/2020 |
| EP | 3627545 | 3/2020 |
| FR | 2918509 | 1/2009 |
| JP | 2000353846 | 12/2000 |
| JP | 2003163512 | 6/2003 |
| JP | 2004063852 | 2/2004 |
| JP | 2005045234 | 2/2005 |
| JP | 2008124351 | 5/2008 |
| JP | 2011203458 | 10/2011 |
| JP | 2018165784 | 10/2018 |
| JP | 2020053565 | 4/2020 |
| JP | 2021153100 | 9/2021 |
| WO | 2019225128 | 11/2019 |
| WO | 2020111257 | 6/2020 |

* cited by examiner

HEADER FOR AN ELECTRIC COMPONENT

CROSS REFERENCE TO RELATED APPLICATIONS

This application claims benefit under 35 USC § 119 of European Application 20 194 345.3 filed Sep. 3, 2020, the entire contents of which are incorporated herein by reference.

BACKGROUND

1. Field of the Invention

The invention generally relates to the packaging of electronic components. In particular, the invention relates to the design of a header, preferably a transistor outline header (TO-header) for mounting an electronic device. The invention is particularly suitable for laser diodes as electronic devices.

2. Description of Related Art

For some opto-electronic applications, the wavelengths of the beam emitted by the laser chip must be controlled precisely. As the wavelength of the laser is temperature dependent. Therefore, the temperature of the laser should be stabilized within a narrow temperature range. To achieve this, it is known to use a thermo-electric cooler (TEC). The TEC may be included within the housing for the laser diode, such as a transistor outline (TO) package. TECs may be used in tandem with directly modulated Lasers (DML) for mid-range distances. The DML is lower in costs as external modulated laser (EML). However, many laser driver ICs are driving the DML with differential signals. In this case, the header needs two RF signal lines. These two signal lines should preferably have a characteristic impedance $Z_0=25$ Ohms or 50 Ohms to avoid signal degradation from reflections others then from the DML.

Further, the TEC has a hot and a cold side. The hot side is connected to the header for heat dissipation. The DML is mounted on the cold side. The cold side should be thermally isolated from the hot side to prevent thermal feedback and a self-heating effect. On the other hand, two RF lines must be connected to the DML. One well known concept is to use two separate RF lines. Each RF line comprises a small printed wire board (pedestal submount) to bring the signal to the DML inside the header. Each pedestal submount may be mounted on a separate pedestal. Typically, the pedestals and the eyelet or base of the header are made in one stamping process as one piece.

In current designs, the RF line may be a ground referenced microstrip line with the signal line on the top side and the ground on the bottom side of the pedestal submount. To connect the DML mounted on a carrier on the cold side of the TEC bond wires are used, because of their very low thermal conductivity. To get access to the ground for the bond wire interconnection, two through hole vias may be used in each pedestal submount. The vias provide interconnection from the bottom side to the top side of the pedestal submount. Using two vias enable a bond wire configuration of ground-signal-ground (GSG) which has much better RF performance as the simple ground-signal configuration.

Because the two RF lines reach the DML from opposite directions, the two pedestal submounts have different metal patterns, which complicates the assembly. Therefore, it is an object of the invention to provide a design for a header which facilitates the assembly and nevertheless provides good RF-performance.

SUMMARY

Accordingly, a header for an electronic component is provided, comprising a base with at least two electrical feedthroughs, each comprising a feedthrough pin extending through the base and being electrically isolated to the base within the feedthrough. The header further comprises at least one pedestal connected to the base, and two submounts. Each submount comprises a carrier or substrate with a structured conductor plating, with the conductor plating comprising at least two conductor traces. One of the conductor traces of each submount is electrically connected to one of the feedthrough pins. The submounts are equally formed. However, the submounts are mounted in different orientations to enable contacting the electronic device from opposite directions.

It is advantageous, if two pedestals are provided. Then, each of the pedestals carries one of the submounts and the pedestals are connected to the base with a gap in between. Within this gap, a mount with the electronic device can be positioned and fastened to the base.

In a preferred refinement of this embodiment, the submounts are mounted onto the at least one pedestal so that the respective ends of those conductor traces that are connected to the feedthrough pins face each other. The conductor traces connected to the feedthrough pins are typically the signal carrying conductors. Thus, using a configuration where the ends distal to the feedthrough pins face each other, the distances for the connection to the electronic device can be reduced.

In a preferred embodiment, the pattern of the structured conductor plating of the submount has a mirror symmetry. This enables to use submounts mounted with different ends pointing towards the base and therewith have the ends of the conductor traces facing each other. Thus, according to a preferred embodiment, the submounts have two opposite ends and are mounted with one end facing the base and wherein a symmetry plane of the mirror symmetrical conductor plating is located between the ends. In particular, the submounts may have two opposite ends, in particular ends that are distinguishable with respect to each other, wherein one of the submounts is attached to the pedestal with one end facing the base and the other submount is attached to the pedestal with the opposite end facing the base. This way, the left and right submounts are of the same type but are simply mounted with one of the submounts turned around by 180°.

DESCRIPTION OF THE DRAWINGS

In the following, the invention will be described in more detail with reference to the accompanying drawings.

DETAILED DESCRIPTION

Figure 1:
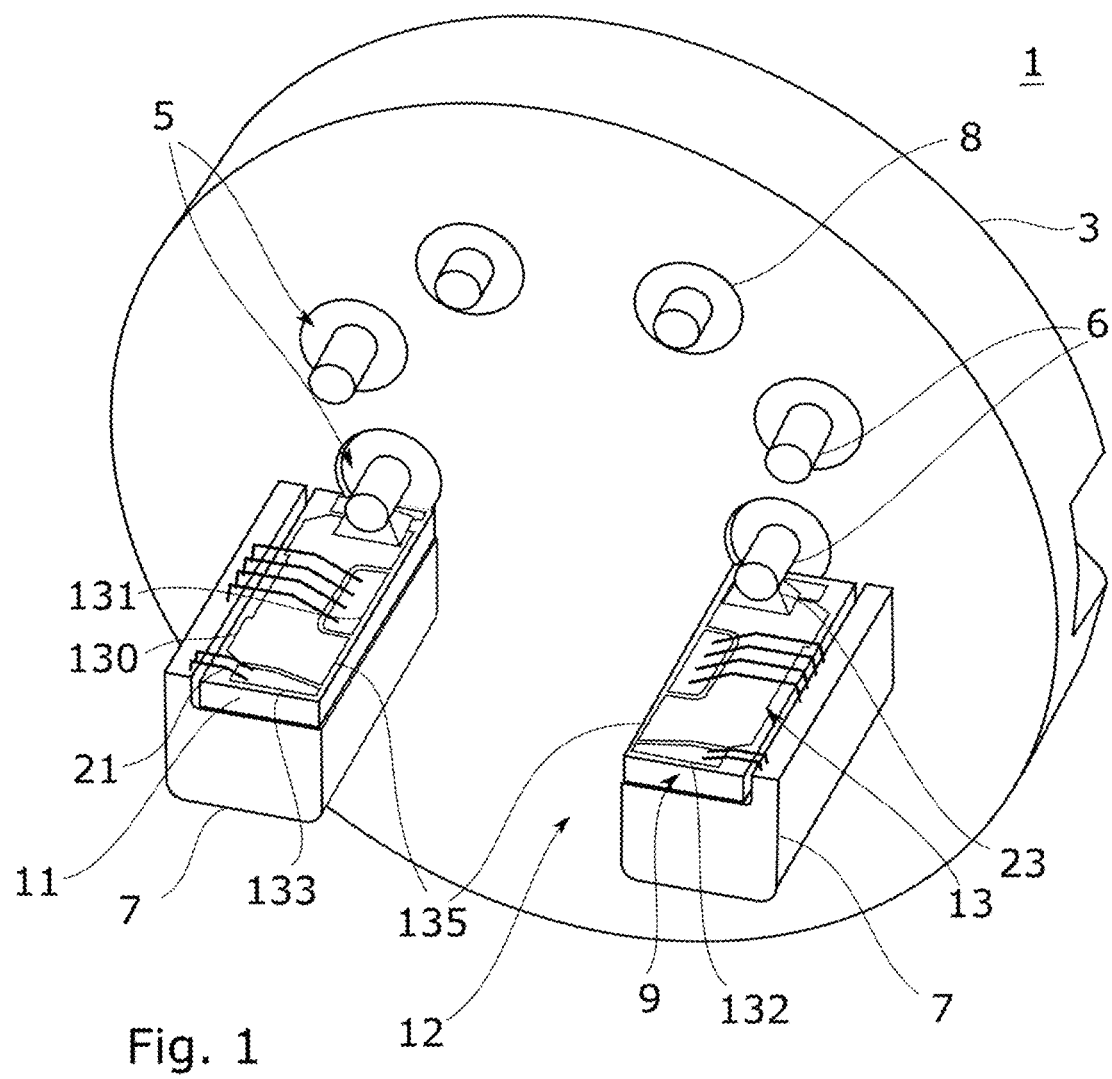
FIG. 1 shows a perspective view of a header with two pedestals.

The header 1 as shown in FIG. 1 comprises a base 3 with two or more electrical feedthroughs 5. The feedthroughs serve to transmit electrical signals in or out of the header 1. Each feedthrough 5 comprises a feedthrough pin 6 that extends through the base 3 and is electrically isolated thereto. For this purpose, the base 3 comprises eyelets 8 filled with an insulating material, preferably glass, in which the feedthrough pin 6 is fixed. In a preferred embodiment, the pin 6 has a diameter in a range from 0.15 mm to 1.0 mm. The projection of the pin over the side of the base 3 carrying the pedestals 7 ("post height") may be in a range of from 0 mm to 1 mm. According to an example, the feedthrough pin 6 has a diameter of 0.25 mm and a post height of 0.4 mm.

Two pedestals 7 are connected to and protrude from the base 3. Without restriction to the specific example as shown, in a preferred embodiment, the pedestals 7 are arranged in a distance with a gap 12 in between. The gap 12 serves to accommodate further elements, in particular an assembly for carrying the electronic device as described further below.

On each of the pedestals 7, a submount 9 is attached. Generally, without restriction to features of the specific exemplary embodiments as shown in the figures, it is contemplated that the pedestals 7 and the base 3 are separate parts, connected together by brazing or soldering, or more generally by an electrically conductive joint. This has the technical advantages that a stamping process for the header without the two pedestals is easier. There are a variety of manufacturing methods for the separate pedestals, such as stamping, metal drawing or extrusion. Further, as the complexity of the design is reduced by separating the manufacturing of header and pedestal, additional features can be implemented in the pedestal. One very advantageous feature is the increased freedom to design the profile of the pedestals. Specifically, the pedestals may have an L-shapes or U-shaped profile. Inter alia, profiles of this shape may be advantageous as they provide stops for the submounts which facilitates positioning thereof. Further, the protrusions of the L- or U-shaped pedestals may provide additional screening of the signal path. Also, a blend or a chamfer edge on the pedestal submount mounting side of the pedestal may be provided.

Each submount 9 comprises a carrier 11. Without restriction to other features of the shown example, the carrier 11 is electrically insulating.

The pedestal submount 9 is preferably made of ceramic material. Suitable materials are Alumina ($Al_2O_3$) and Aluminum Nitride (ALN). If thermal conductivity is of less importance, the pedestal submount 9 can be also made of glass, for instance.

According to a preferred embodiment, the thickness of the pedestal submount 9 is between 0.1 mm to 0.5 mm. A typical thickness is 0.2 mm. In case of a focused electro-optical device as the electronic device to be accommodated on the header, the length of the pedestal submount may be selected based on the focal length of the lens. For example, the lens may couple the light from a DML into a glass fiber. A typical pedestal submount length is between 1.0 mm and 3 mm, e.g. 2.13 mm or 2.5 mm. The width of the pedestal submount 9 according to a further preferred embodiment is between 0.5 mm to 1 mm. A typical width is 0.77 mm.

From the manufacturing perspective, it has many advantages to have just one kind of pedestal submount 9, which can be used for both pedestals 7. To achieve this, the pedestal submount is symmetrical to the middle of its length. Thus, as stated above, the plane of mirror symmetry extends between the ends of the submount 9. This means that the metal pattern on the top side is symmetrical to this line. However, the electrical interconnections on both ends of the pedestal submount may be different. At the base side, the RF pin can be connected by a solder joint 23 to the pedestal submount 9. At the other end, a bond wire interconnection with ground-signal-ground configuration is connected. To accomplish this with the same metal pattern at both pedestal submount ends, the metal shapes are connected to different nets depending if the pedestal submount is used on the left or right pedestal.

The carrier 11 carries a structured conductor plating 13 with conductor traces 130, 131, 132, 133. For both submounts 9, conductor trace 130 is electrically connected to the feedthrough pin 6 of an electrical feedthrough 5 to transmit the HF signals to the electronic device to be mounted in the gap 12. As is evident from FIG. 1, the ends 135 of the conductor traces 130 distal to the feedthrough pins 6 face each other. Further, the structuring of the conductor plating 13 is designed so that both submounts 9 including the conductor traces 130, 131, 132, 133 are identical. However, the submounts 9 are mounted with the orientation of one submount 9 being flipped with respect to the other submount 9. Specifically, one submount 9 is rotated with respect to the other about an axis perpendicular to the face of the carrier 11 carrying the conductor plating 13. This way, the ends 135 of conductor traces 130 point toward each other, although the patterns of the conductor platings 13 are the same.

Further, the conductor traces 131, 132, 133 serve as grounded conductors. This way, the signal carrying conductor traces 130 are flanked by the grounded conductors to provide shielding and good RF-performance. Thus, specifically and without restriction to the shown specific example, at least one conductor trace of the conductor plating 13 may be grounded. Further, generally, a ground connection to a conductor trace may be established by at least one bond wire connection 21. To provide a good connection, as also shown in FIG. 1, two or more bond wire connections 21 may be attached in parallel for a conductor trace to provide a low impedance connection.

Figure 2:
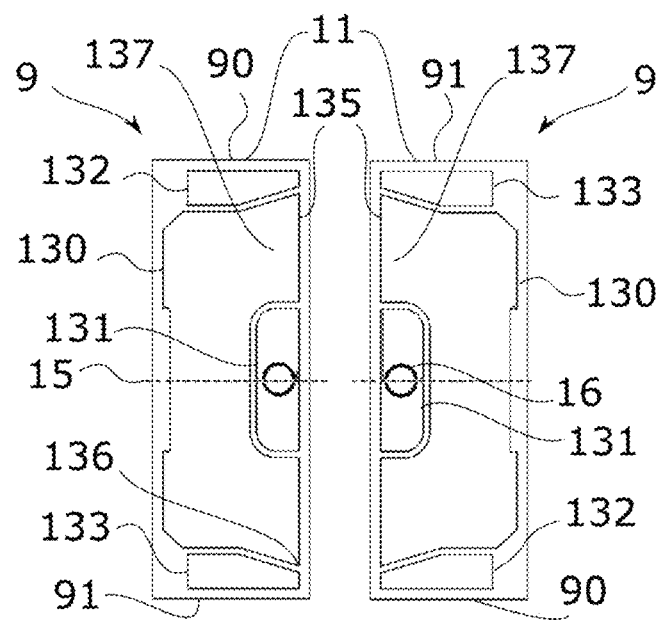
FIG. 2 shows a top view onto two submounts.

FIG. 2 shows an arrangement of two submounts 9 in top view onto the conductor plating 13. FIG. 2 is also an example for a preferred embodiment, according to which the pattern of the structured conductor plating 13 of the submount 9 has a mirror symmetry. The symmetry plane 15 is shown in FIG. 2 for both submounts 9. According to a further refinement of this embodiment, the submounts 9 have two opposite ends 90, 91 and are mounted with one end 90, 91 facing the base 3. As also realized in the example of FIG. 2, a symmetry plane 15 of the mirror symmetrical conductor plating 13 is located, or extends, respectively, between the ends 90, 91. The two identical submounts 9 are shown in their relative orientation in which they are attached to the pedestals 7.

According to a further embodiment, the submounts 9 are assembled so that a mirror plane extends between the submounts 9. Thus, the arrangement of the submounts and preferably also of the pedestals as shown in FIGS. 1 and 2 is mirror symmetric with respect to two mirror planes, i.e.

one plane extending between the ends 90, 91 of the submounts and one plane in the middle between the submounts 9, or pedestals 7, respectively.

It is evident from FIG. 2, that in general, the submounts 9 may have two opposite ends 90, 91, which are distinguishable with respect to the pattern of the conductor plating. Then, one of the submounts 9 can be attached to the pedestal with one end 90 facing the base 3 and the other submount 9 is attached to the pedestal with the opposite end 91 facing the base 3. Due to this orientation and the shape of conductor trace 130, its respective ends 135 then face each other, as is evident from FIG. 2.

Further, it is advantageous, if one conductor trace of the structured conductor plating 13 is U-shaped. In the example of FIG. 2, this feature is realized for conductor trace 130. Specifically, one of the limbs 137 of the U-shaped conductor trace 13 forming an end 135 facing the end 135 of a conductor trace 130 of the other submount 9.

According to a refinement of this embodiment, a further conductor trace is arranged between the limbs 137 of the U-shaped conductor trace 130. In the example of FIG. 2, this is the case for the D-shaped conductor trace 131.

As can be seen from the examples of FIG. 1 and FIG. 2, the submounts 9 each have four conductor traces 130, 131, 132, 133. Conductor traces 130 is on both sides part of the signal line.

According to a further refinement of the embodiment with the U-shaped conductor trace, a conductor trace is arranged between a limb 137 of the U-shaped conductor trace 130 and the end 90, 91 of the submount 9 proximal to the limb. In the example shown in FIG. 2, this holds for conductor traces 132 and 133.

As in the example of FIG. 1, the grounded conductor traces 131, 132, 133 may be connected by bond wires. According to another alternative or additional embodiment, the submounts 9 comprise at least one electrical via 16 connecting a conductor trace 130, 131, 132, 133 to the side of the carrier 11 opposite to the side with the structured conductor plating 13. As this opposite side rests on the pedestal, a ground connection may be established from the pedestal through the via 16 to the conductor trace. On both submounts, D-shaped conductor trace 131 is connected to ground (ground pad). This may be realized by bond wire connections 21 as in the example of FIG. 1, or by a via 16, as it is shown in FIG. 2. By means of the via 16, the conductor trace 131 is grounded, as the via 16 establishes electrical contact to the pedestal 7. If it is assumed that in FIG. 2 the respective lower ends 91, 90 of the submounts 9 are facing the base 3, then, conductor trace 132 of the left submount 9 is connected to ground and on the right-side, conductor trace 132 is part of the signal line. This may be achieved if a solder joint to the feedthrough pin 6 contacts this conductor trace additionally to conductor trace 130. Vice versa, conductor trace 133 is on the left side part of the signal line and on the right side connected to ground. Thus, conductor traces 132, 133 changed the nets depending on which pedestal 7 the submount 9 is mounted.

However, the via 16 is optional. If a via 16 is omitted, a thinner submount 9 can be used. For instance, the thickness can be reduced from 0.2 mm with via to a thickness of 0.15 mm without via. Because no laser drilling is needed, the submount 9 is not hard stressed. With a thinner submount 9, the linewidth of the microstrip line can be reduced for the same line impedance $Z_0$. For a line impedance $Z_0$=25 Ohm the linewidth can be reduced from 0.67 mm to 0.50 mm using a thinner submount 9. The difference is 0.16 mm. In a compact, full packed TO header assembly, this is a great advantage.

Generally, as in the example of FIG. 1, grounding of these conductor traces 132, 133 may be achieved by bond wire connections 21. Specifically, as shown, two bond wires may be used in each case. Further, the bond wires are connected to an elevated side wall or rib shaped protrusion of the pedestal 7. Due to this protrusion, the pedestals 7 have an L-shaped cross section.

As the grounded D-shaped conductor trace 131 and conductor traces 132, 133 are bracketing the signal conductor, i.e. the U-shaped conductor trace 130, a coplanar waveguide structure is established at least at the end 135 facing towards the corresponding end 135 of conductor trace 130 on the opposite submount 9.

For instance, four bond wires are used to connect shape D with the side wall of the L-shape pedestal. The bond wires are crossing the signal path shape C. Because the bond wires are exact perpendicular to the signal propagation direction no signal coupling occurs. The signal remains un-disturbed. Two technical advantages are created by the crossing bond wire interconnection:

A multitude of bond wire connections 21 may be advantageous for achieving a low impedance. Moreover, the bond wire array over the microstrip line, which is established by the conductor traces, enable a smaller line width for the same line impedance as without the bond wire array. This is very important, because due to the space required by conductor trace 131, the linewidth of the microstrip line becomes narrower. The bond wire array acts like a ground plane above the microstrip. In this section the RF line is a mixture of microstrip line and suspended RF line.

The effect of a ground plane above the RF signal conductor trace increases the capacitance of the RF line. Consequently, the linewidth can be reduced to maintain the same line impedance $Z_0$. Since the RF signal conductor trace 130 is surrounded by air with $\square_r$=1, the line impedance does not depend strongly on the distance between RF line and bond wire array.

Further, the dense bond wire array provides a shielding over the microstrip line, or more general, over the conductor plating 13 forming a high frequency signal line. This shield prevents unwanted signal coupling to other components inside the header. For instance, a monitor diode or an NTC resistor (thermistor) for measurement of temperature may be influenced by electromagnetic radiation from the signal lines.

Figure 3:
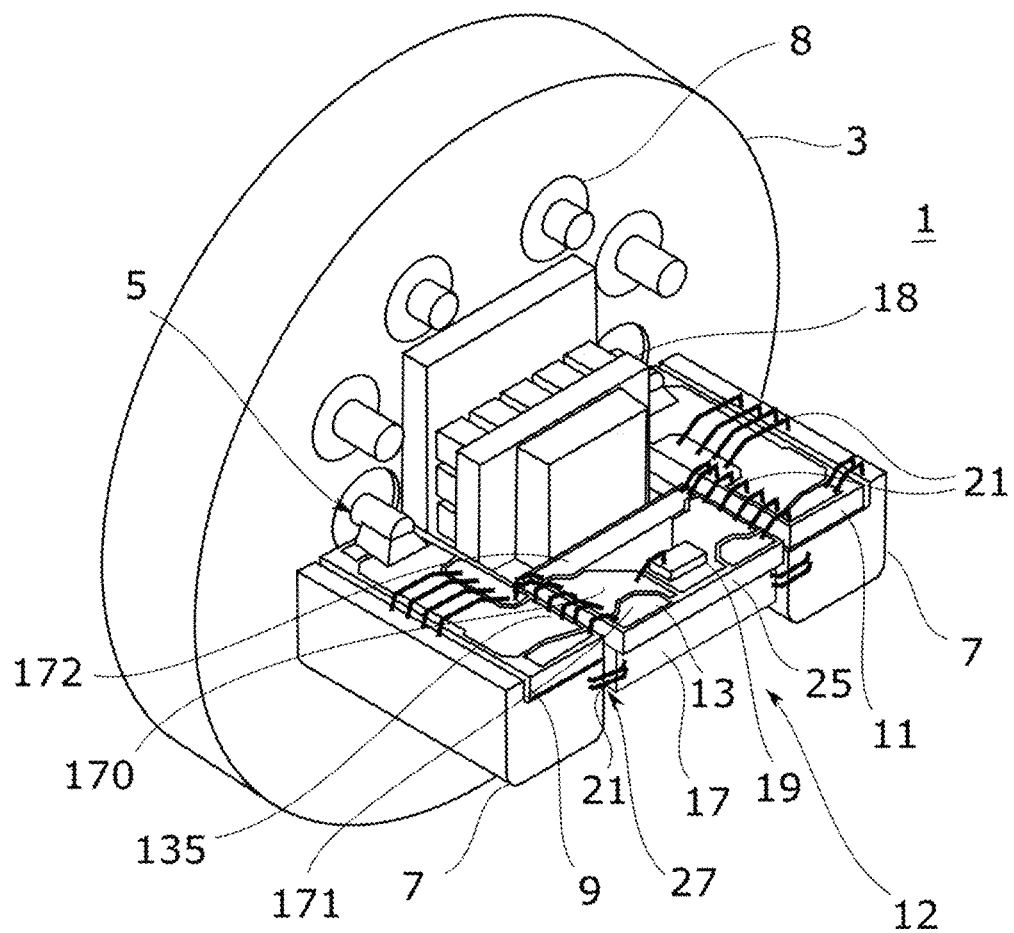
FIG. 3 shows the header provided with a mount for an electronic component.

FIG. 3 shows the header 1 further assembled. Generally, a mount 17 for an electronic device 19 is arranged between the two submounts 9, wherein ends 135 of the conductor tracings 130 of the submounts 9, preferably ends 135 facing each other, are provided with bond wire connections 21 for connecting the electronic device 19.

It is preferred to mount the electronic device 19 onto a further submount. This device submount 25 is attached to the mount 17. Device submount 25 also has a structured conductor plating 13.

Preferably, the mount 17 is not directly fastened to the base 3. Rather, the mount 17 is attached to a thermoelectric cooler 18, wherein the thermoelectric cooler 18 is coupled to the base 3 to dissipate heat to the base 3. There is a remaining gap between the mount 17 and the pedestals 7 to avoid a thermal shortcut. However, the mount 17 may be electrically grounded by further bond wire connections 21 to the pedestals 7, as shown.

The bond wire connections from the submounts 9 to the device submount 25 are advantageous to have an interconnection with very low thermal conductivity. On the other hand, bond wire interconnections have high parasitic inductances which degrade especially the high frequency signals. However, with a ground-signal-ground (G-S-G) bond wire configuration, the parasitic inductance can be significantly reduced. The ground, which may in this case also be referred to as the return path, is realized with two ground conductors framing the signal conductor. In particular, this G-S-G-configuration is realized both on the submounts 9 and the device submount 25 to achieve good RF-performance. Thus, according to a preferred embodiment, the submounts 9 have a structured conductor plating 13 which has a signal carrying conductor trace 130 connected to a respective feedthrough pin 6 and which is at least partly flanked on both edges by grounded conductors, preferably grounded conductor traces 131, 132, 133, and wherein the signal carrying conductor trace 130 is connected to a signal conductor trace 170 on the mount 17 for the electronic device, wherein the signal conductor trace 170 on the mount 17 is as well flanked on both edges by grounded conductor traces 171, 172. Preferably, as in the shown embodiment of FIG. 3, the conductor traces 170, 171, 172 are not directly arranged on the mount 17, but rather placed on a device submount 25.

Figure 4:
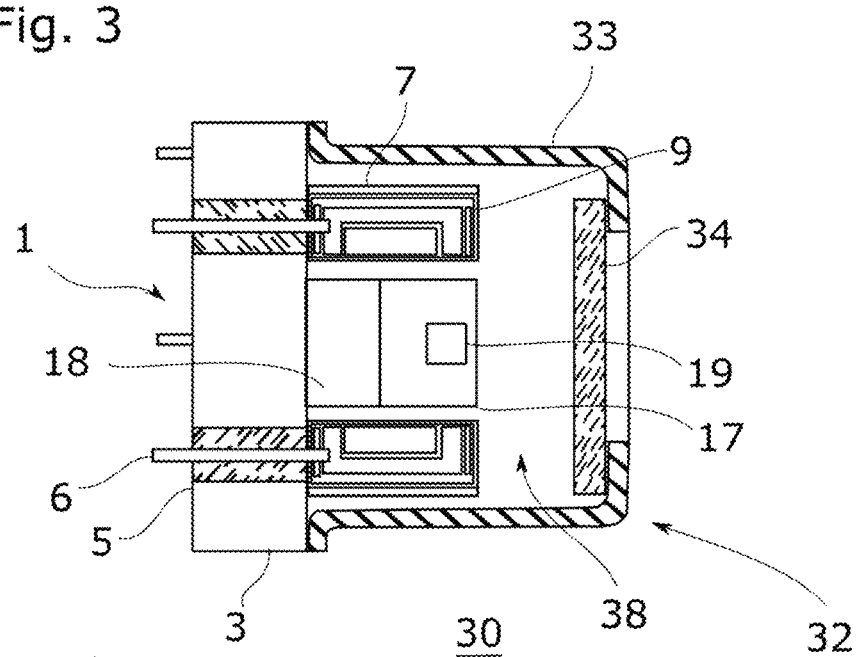
FIG. 4 shows an electronic component with a header.

FIG. 4 shows an electronic component 30 with a header 1 as described herein. An electronic component 30 according to this disclosure is understood as a component with a housing which accommodates an electronic device and terminals to electrically connect the electronic device within the housing. Generally, without the specific example of FIG. 4, an electronic component 30 is provided, having a housing 32. The housing 32 encloses an electronic device 19 and includes the header 1 according to this disclosure. The electronic device 19 is mounted on the header 1. Further, the housing 32 comprises a cap 33, which is attached to the header 1 so that a cavity 38 is provided, wherein the electronic device 19 is arranged within the cavity 38.

In a preferred embodiment, the electronic device 19 is an optoelectronic device for sending or receiving optical signals. For this application, the housing 32 comprises a transparent member 34 to transmit the optical signals into or out of the housing 32. In the exemplary embodiment of FIG. 4, the transparent member 34 is a glass window inserted into an opening of the cap. However, other transparent members such as light guides or lenses may be used, depending on the application.

Generally and without restriction to the depicted embodiment, the optoelectronic device may be a laser diode, preferably a direct modulated laser diode (DML) which transmits the emitted laser light through the transparent member 34. The DML can be operated with either differential signals or singled ended so that two signal paths are used, wherein a conductor trace on each submount 9 is connected to a feedthrough pin 6 to transmit a part of the differential signal.

Figure 5:
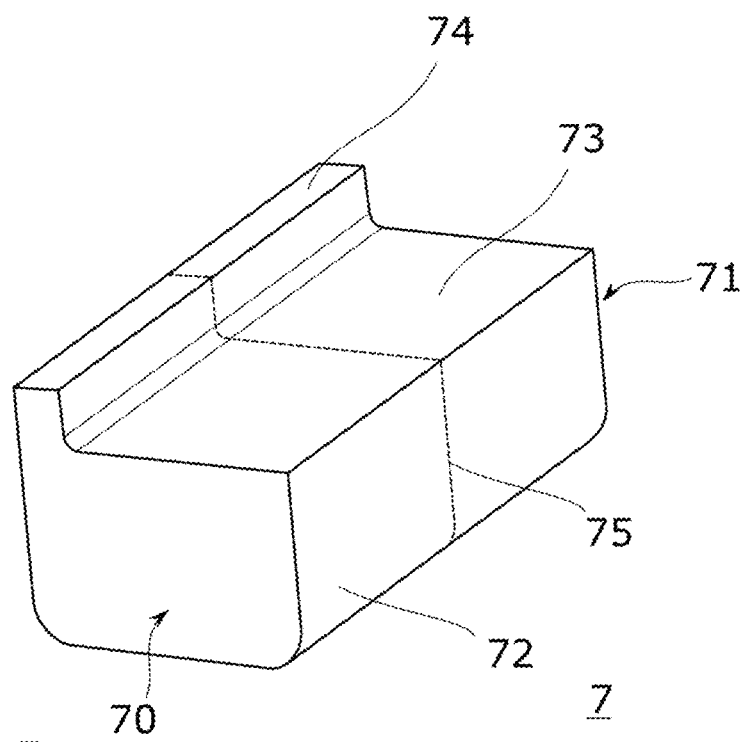
FIGS. 5-6 show pedestals for a submount.

FIG. 5 shows a pedestal 7 as it is also part of the embodiments of FIG. 1 and FIG. 3. The pedestal 7 has two end faces 70, 71. The pedestal 7 is mounted to the base 3 with one of its end faces 70, 71. The fastening of the pedestal 7 to the base 3 is preferably done by brazing, e.g. using an AuSn-solder or AuGe solder. The profile of the pedestal 7 has an L-shape due to a sideward protrusion 74 in the form of a rib or bar. The protrusion 75 extends laterally along a mounting face 73. The mounting face 73 serves to mount and fix the respective submount. Although the profile of the pedestal 7 is not symmetric, the pedestal 7 has a mirror symmetry with a mirror plane extending between the two end faces 70, 71. The intersection of the mirror plane with the surface of the pedestal 7 is shown as a hatched line 75. This symmetry feature is similar to that of the submounts 9. Thus, without restriction to the specific profile of the embodiment of FIG. 5, a preferred embodiment of the header is based on the features that two equal pedestals 7 are provided, each of the pedestals 7 carrying one of the submounts 9, wherein the pedestals 7 on the base 3 have a mirror symmetry. Further, similarly to the orientation of the submounts 9, one of the pedestals 7 is attached to the base 3 with one end face 70 and the other pedestal 7 is attached to the base 3 with the opposite end face 71.

As both the pedestals and the submounts 9 may be mounted with respective opposite sides facing the base, it is possible to assemble the submounts 9 and pedestals 7 to obtain equal submount assemblies and to fasten the submount assemblies with respective opposite end faces to the base 3.

In a preferred embodiment, the protrusion 74 may have the same height as the submount 9, or the ratio of the height of the protrusion 74 to the height of the submount 9 is between 0.5 and 1.5. The height of the protrusion is preferably between 0.1 mm and 0.5 mm. A typical height is about 0.2 mm. The width of the protrusion may be between 0.1 mm and 0.3 mm. A typical width is 0.175 mm. The L-shaped profile has several advantages. The ground is accessible easily from the top side of the pedestal submount. Because the protrusion is of solid metal and is as long as the pedestal submount 9 itself, this ground area has low inductance and is therefore preferred for RF application.

Further, the protrusion serves as an electro-magnetic shielding. The EM-Field inside the pedestal submount 9 can not extent over the pedestal in negative x-direction as it is possible without side wall. This way, a metal cap of the housing can be placed closer to the pedestal without EM coupling with the cap. Moreover, the protrusion serves as an alignment tool in the pedestal submount assembling process. The pedestal submount can be assembled more precisely.

Another realization is of course a flat pedestal 7. In other words, in this case, the side of the pedestal 7 with the mounting face 73 is plane. In this case, the bond wires 21 must go down to the pedestal surface to get in contact with ground. This makes the bond wire longer. This may not be advantageous for very high frequency applications. On the other hand, this design is simple and also allows to use two equal pedestals. This embodiment is particularly suited for applications with lower signal rates to save costs.

Figure 6:
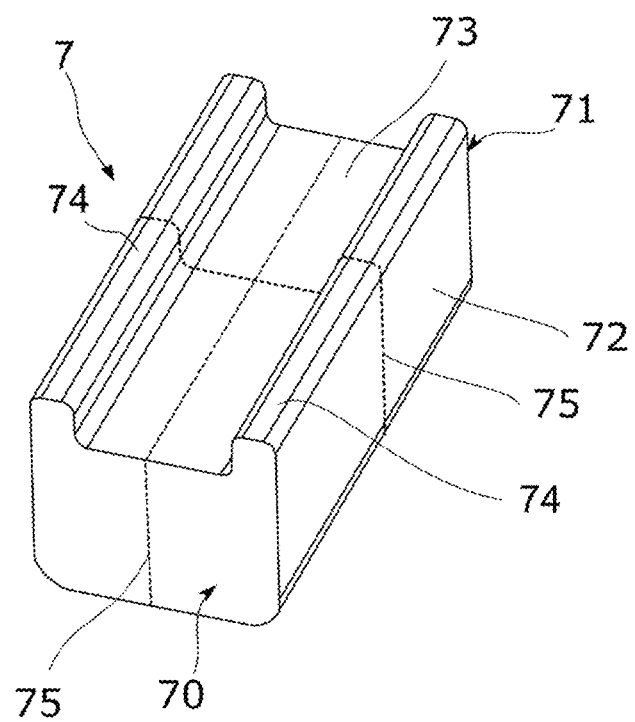

FIG. 6 shows an alternative embodiment of a pedestal 7. In difference to the embodiment of FIG. 5, this embodiment has a U-shaped profile with protrusions 74 extending along opposite sides of the mounting face 73. According to one embodiment, which is also realized by the U-shaped profile, the pedestal 7 may generally have a mirror symmetric profile. The mirror plane in this case extents parallel to the protrusion through the center of the profile. The intersections 75 of both symmetry planes are shown in FIG. 6. In this case with a double mirror symmetry, the pedestals 7 can be attached to the base 3 with either of the end faces 70, 71 without altering the design.

As also in the example of FIG. 5, these protrusions 74 may serve to provide a ground-signal-ground configuration as well. Specifically, in the embodiment with the L-shaped profile of the pedestal 7, the protrusion 74 is a grounded conductor which flanks the side of the C-shaped conductor trace 130 which is opposite to the side facing the d-shaped conductor trace 131. In the embodiment of FIG. 6, the signal conductor trace may be flanked on both sides by the protrusions 74, which are electrically grounded. Thus, a D-shaped conductor trace 131 as in the example of FIG. 5 may be omitted.

Figure 7:
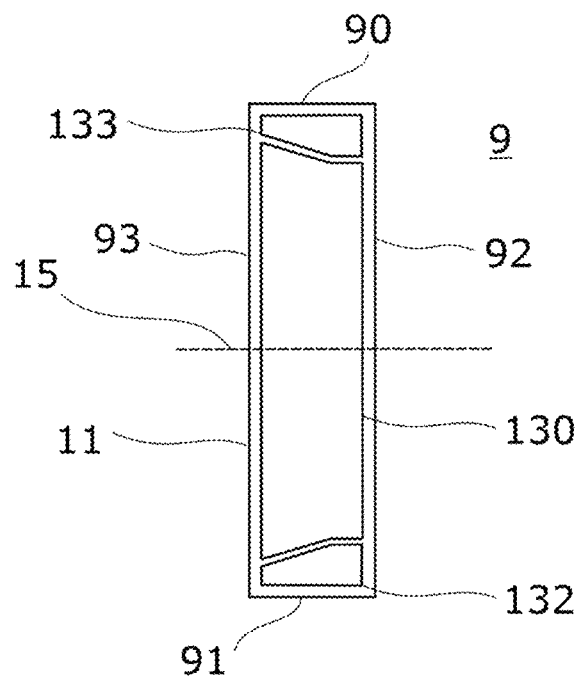
FIG. 7 shows a further embodiments of a submount.

A submount 9 which fits to a U-shaped pedestal 7 is shown in FIG. 7. As the embodiment with the C-shaped conductor trace, a symmetry plane 15 extends between the ends 90, 91.

Figure 8:
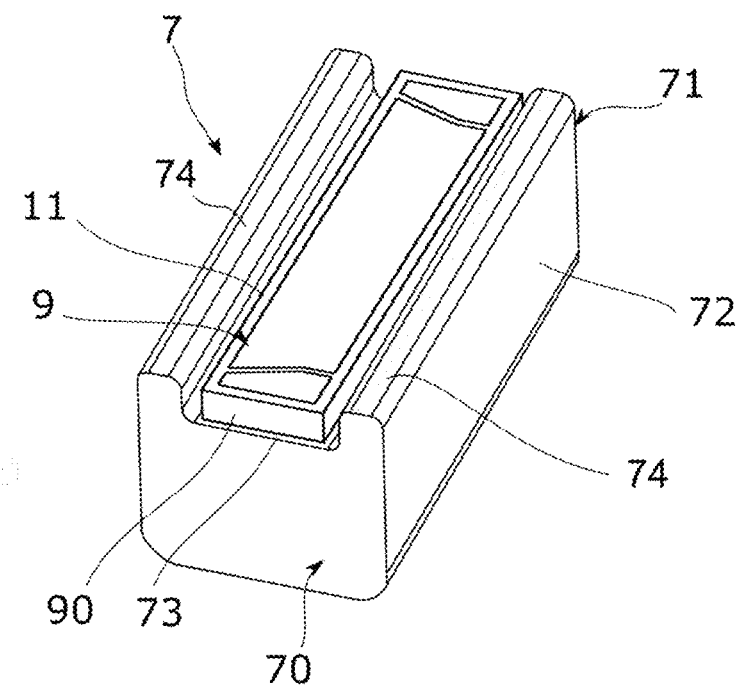
FIG. 8 shows an assembly of the pedestal of FIG. 6 and the submount of FIG. 7.

FIG. 8 shows the assembly of the pedestal 7 of FIG. 6 and the submount 9 of FIG. 7. As the example of the submount 9 of FIG. 7 has no further mirror symmetry plane in direction parallel to the side edges 92, 93, the assembly lacks of a second symmetry plane defined by the symmetry of the profile of the pedestal 7. However, similar to the L-shaped pedestal 7, the assembly may be preassembled and mounted to the base 3 with the respective end faces 70, 71. Similarly, so that the assemblies are equal, but arranged mirror symmetrical on the base 3. Thus, as for the embodiment with the L-shaped pedestal, the submounts 9 are equal and have two opposite ends 90, 91, wherein one of the submounts 9 is attached to the pedestal 7 with one end 90 facing the base 3 and the other submount 9 is attached to the pedestal with the opposite end 90 facing the base 3.

Figure 9:
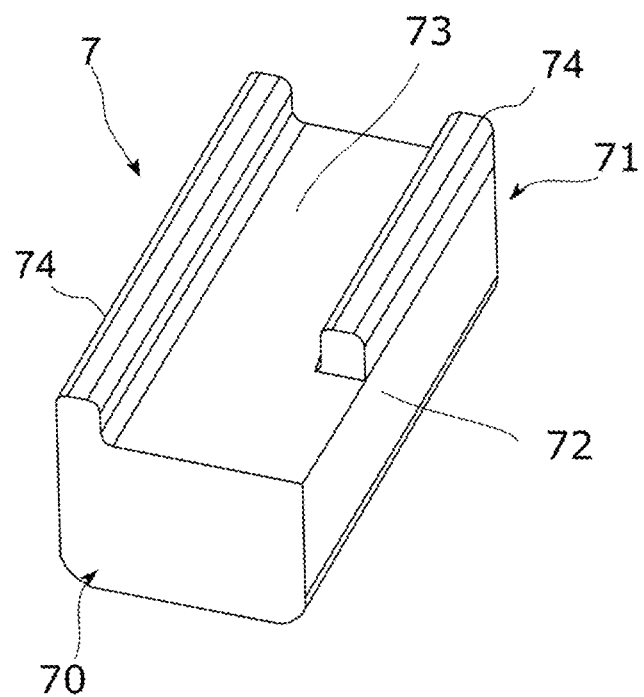
FIG. 9 shows a pedestal with both a L-shaped and a U-shaped profile.
Figure 10:
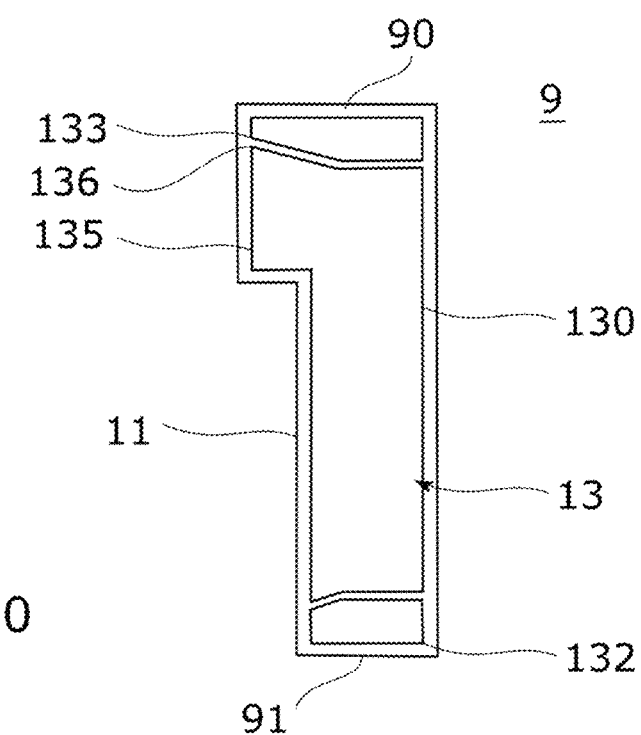
FIG. 10 shows a L-shaped submount.

FIG. 9 shows an embodiment of a pedestal 7 having a L-shaped profile at end 70 and a U-shaped profile at the opposite end 71. The different profiles result from one of the protrusions being shorter than the other protrusion 74. Due to this design, the mounting face 73 is L-shaped. Obviously, this embodiment lacks of a mirror symmetry. However, the L-shaped submount 9 according to FIG. 10, which fits to the L-shaped mounting face 73 of the pedestal of FIG. 9, may still have a mirror symmetry. This allows to fabricate left and right submounts 9 as equal parts. Specifically, on both opposite faces of the carrier 11 a structured conductive plating 13 may be arranged, wherein the conductive platings 13 have a mirror symmetry with a symmetry plane extending centered between the sides of the submount 9, or the carrier 11, respectively. Of course, this feature is not restricted to the particular L-shaped design of FIG. 10. Rather, a front- and backside-plating may be present at all embodiments of submounts 9 disclosed herein. FIG. 10 is a top view onto one of the sides of the carrier 11. Accordingly, the plane of mirror symmetry is parallel to the side shown in FIG. 10 and thus extends parallel to the plane of projection of FIG. 10. Thus, according to one embodiment, a header 1 is provided, further comprising at least one pedestal 7 connected to the base 3, and two equal submounts 9, each submount 9 comprising a carrier 11 with structured conductor platings 13 on two opposite sides, wherein a plane of mirror symmetry extends parallel to and between the two opposite sides.

According to a further advantageous embodiment, the end 135 of the conductor trace 130 which is distal to the end connected to the feedthrough pin 6 is widened. Widening is understood as a broadening of the width of the conductor trace towards its end distal to the feedthrough pin 6. This embodiment is also realized and visible in the examples of FIGS. 1, 2 and 3. Generally, the widening may be achieved by providing a projecting edge 136 at the end 135 distal to the end connected to the feedthrough pin. Preferably, as also in the depicted embodiments, only one side of the end of the conductor trace 130 connected to the feedthrough pin is widened. Accordingly, there is only one projecting edge at the end 135 of the conductor trace 130. This is preferred in case of space limitations.

Figure 11:
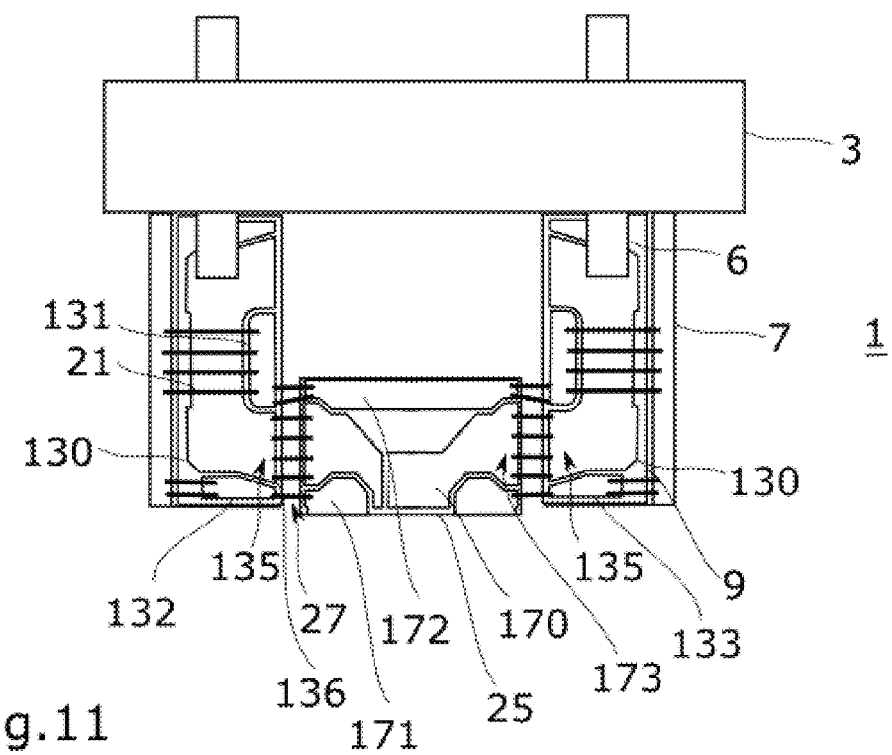
FIG. 11 is a top view onto the header.

FIG. 11 is a top view onto the header 1. The mount 17 and the thermoelectric cooler are not shown for the sake of simplicity. The conductor pattern of the device submount 25 has a ground-signal-ground configuration similar to the conductor pattern 13 on the submounts 9. Specifically, the signal conductor traces 130 on the submounts 9 are connected to signal conductor traces 170 on the device submount 25 and the grounded conductor traces 131, 132, 133 on the submounts 9 are connected to the ground conductor traces 171, 172 on the device submount 25. The connections are established by bond wire connections 21.

As described with respect to FIG. 10, it is advantageous to widen the end 135 of the signal carrying conductor trace 130 on the pedestal 9. Further, also the signal conductor traces 170 on the device submount 25 are widened at their respective ends 173 with which they are connected to the conductor traces 130 by the bond wire connections 21. The widening of the ends 135 and 173 increases the line capacitance. This design is advantageous because the addition of capacitance lowers the effective impedance of the bond wire connections 21. Specifically, the widening of the signal carrying conductor traces 130, 170 can at least partly compensate an increase of the line impedance induced by the bond wire connections. Thus, in addition to the feature that the end 135 of the conductor trace 130 of each submount 9 which is distal to the end connected to the feedthrough pin 6 is widened, both ends of the signal conductor traces on submounts 9, 25 may be widened. Accordingly, a header 1 with a device submount 25 for mounting the electronic device 19 is provided, wherein a conductor trace 130 on the submount 9 is connected to a feedthrough pin 6, and wherein this conductor trace 130 is connected to a signal conductor trace 250 on the device submount 25, wherein the connection is established by at least one bond wire connection 21 bridging a gap 27 between the submount 9 and the device submount 25, and wherein the ends 135, 173 of the conductor traces 130, 170 which are connected by the bond wire connection 21 are widened.

Figure 12:
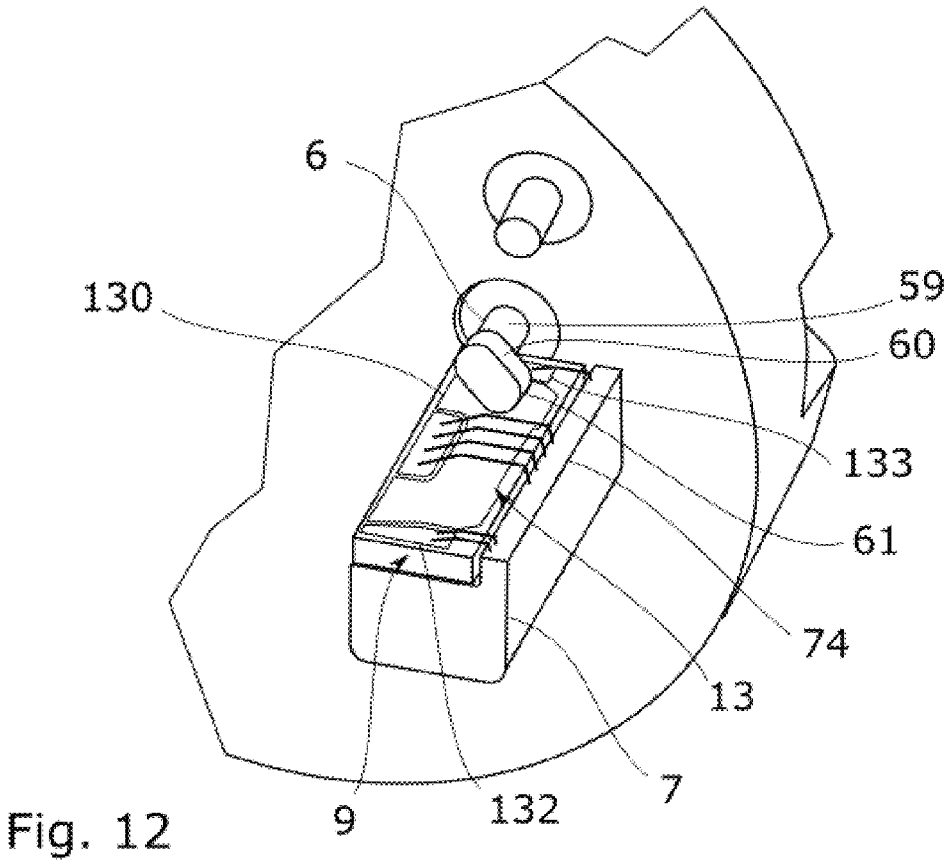
FIG. 12 shows a variant of the embodiment of FIG. 1 with a feedthrough pin having a head.

FIG. 12 shows a section of the header 1 with one of the pedestals 7 and represents a variant of the embodiment of FIG. 1. Specifically, this variant concerns the electrical connection of the feedthrough pin 6 to the signal conductor trace 130. In the embodiment of FIG. 1, the feedthrough pin is a cylindrical or wire like member. However, according to one embodiment, the feedthrough pin 6 includes a head 60, wherein the head 60 is formed and arranged or positioned so as to reduce the distance of the pin 6 to the conductor plating 13 of the submount 9. Reducing the distance is advantageous to reduce the insertion loss at the junction between pin 6 and submount 9. According to a refinement, which is realized in the shown example, the head has a shape resembling that of a golf club. The shape of the pin 6 may also described as having a shaft 59 and a head 60 with a wing 61 that extends transverse to the longitudinal direction of the pin 6 so that the end of the wing 61 juts over the circumferential surface of the shaft 59. In particular, the wing 61 may then be oriented so that the distance to the conductive plating 13 on the submount 9 is reduced. Further, the head 60 can be used to bridge the conductor trace 133 nearest to the base 3. Then, this conductor trace 133 may be grounded, e.g. as shown using a bond wire connection 21 to the projection 74 of the pedestal 7.

Figure 13:
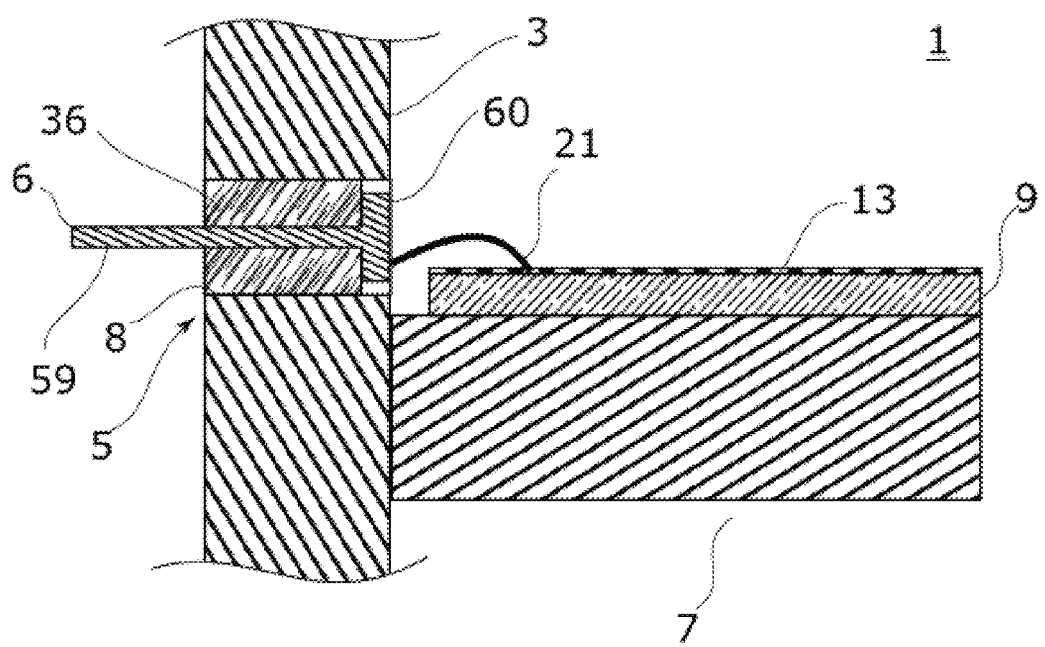
FIG. 13 is a cross sectional view of a part of the header.

FIG. 13 is a cross sectional view of a part of the header 1 and shows an example of an alternative embodiment of a feedthrough 5. Generally, as for all embodiments disclosed herein, the feedthrough 5 may include a glass insulation 36 to fix the feedthrough pin 6 within the opening or eyelet 8. As in the example of FIG. 12, the feedthrough pin 6 has a head 60.

Further, FIG. 13 is an example of having one or more embodiments as follows—and any combinations thereof. In some embodiments, the head 60 can have a larger diameter than the shaft 59 of the pin 6.

In other embodiments, the head 60 does not protrude out of the eyelet 8. Due to this configuration, the conductive plating 13 can be positioned very close to the head 60, thereby reducing insertion losses. The recessed glass insulation 36 further makes sure that no insulation material can protrude out of the eyelet 8 due to tolerances in the fabrication. Protruding glass portions could prohibit placing the submount 9 over the eyelet 8. Further, the recessed glass together with the heads increased diameter result in an improved impedance matching.

In another embodiment, the glass insulation 36 is recessed within the eyelet 8 so that the head 60 protrudes from the glass insulation 36 within the eyelet 8.

In still other embodiments, the submount 9, viewed along the longitudinal direction of the pin 6 covers a part of the eyelet 8 or the head 60. Here, the surface of the submount 9 with the structured conductive plating 13 is at a height that it crosses the eyelet 8, or even the head 60 if viewed along the shaft 59 of the pin 6. Due to this configuration, the conductive plating 13 can be positioned very close to the head 60, thereby reducing insertion losses. The recessed glass insulation 36 further makes sure that no insulation material can protrude out of the eyelet 8 due to tolerances in the fabrication. Protruding glass portions could prohibit placing the submount 9 over the eyelet 8. Further, the recessed glass together with the heads increased diameter result in an improved impedance matching.

LIST OF REFERENCE SIGNS

1 header
3 base
5 electrical feedthrough
6 feedthrough pin
7 pedestal
8 eyelet
9 submount
11 carrier
12 gap
13 conductor plating
15 symmetry plane
16 via
17 mount for electronic device
18 thermoelectric cooler
19 electronic device
21 bond wire connection
23 solder joint
25 device submount
27 gap between mount 17 and pedestal 7
30 electronic component
32 housing
33 cap
34 transparent member
36 glass insulation
38 cavity
59 shaft
60 head
61 wing
70, 71 end of 7
74 projection
90, 91 end of submount 9
92, 93 side edge of submount 9
130, 131, 132, 133 conductor trace
135 end of conductor tracing
136 projecting edge
137 limb of U-shaped conductor trace
170 signal conductor trace on 25
171, 172 ground conductor trace on 25
173 end of 170

What is claimed is:

1. A header for an electronic component, comprising:
   a base having a first electrical feedthrough and a second electrical feedthrough;
   a first feedthrough pin in the first electrical feedthrough;
   a second feedthrough pin in the second electrical feedthrough, wherein the first and second feedthrough pins extend through the base and are electrically isolated to the base within the first and second electrical feedthroughs, respectively;
   a pedestal connected to the base; and
   two submounts each comprising a carrier with a structured conductor plating, the structured conductor plating comprising at least two conductor traces, with one of the at least two conductor traces of each of the two submounts being electrically connected to one of the first and second feedthrough pins,
   wherein the two submounts have an identical structure but are mounted onto the pedestal so that a first submount is flipped with respect to a second submount,
   wherein the structured conductor plating has a pattern that is a mirror symmetrical with respect to a symmetry plane, and
   wherein the symmetry plane is located between two opposite ends of each of the two submounts.

2. The header of claim 1, wherein the two submounts are mounted onto the pedestal so that ends of the at least two conductor traces that are connected to the first and second feedthrough pins face each other.

3. The header of claim 1, wherein one of the two submounts is attached to the pedestal with one end facing the base and another of the two submounts is attached to the pedestal with an opposite end facing the base.

4. The header of claim 1, wherein one of the at least two conductor traces is U-shaped having one of limbs forming an end that faces an end of a conductor trace of the other of the two submounts.

5. The header of claim 1, comprising a feature selected from a group consisting of: a further conductor trace arranged between limbs of a U-shaped conductor trace; a further conductor trace arranged between a limb of a U-shaped conductor trace and an end of one of the two submounts proximal to the limb; a widened end a conductor trace of the two submounts that is distal to an end connected to the first and second feedthrough pins, respectively; a device submount for mounting the electronic device; and a head of the first and second feedthrough pins, respectively, is formed and positioned so as to reduce a distance of the feedthrough pins to the conductor plating.

6. The header of claim 1, wherein the two submounts further comprise at least one electrical via connecting the at least two conductor traces to a side of the carrier opposite to a side with the structured conductor plating.

7. The header of claim 1, further comprising a second pedestal connected to the base with a gap between the second pedestal and the pedestal, wherein the pedestal and the second pedestal each carry one of the two submounts.

8. The header of claim 7, further comprising a mount arranged between the two submounts, wherein the at least two conductor traces have ends having bond wire connections for connecting an electronic device.

9. The header of claim 8, wherein the mount is attached to a thermoelectric cooler, the thermoelectric cooler being coupled to the base to dissipate heat to the base.

10. The header of claim 1, wherein the structured conductor plating has a signal carrying conductor trace connected to the first and second feedthrough pins, respectively, and which is at least partly flanked on both edges by grounded conductors.

11. The header of claim 10, wherein the grounded conductors comprise grounded conductor traces.

12. The header of claim 10, wherein the signal carrying conductor trace is connected to a signal conductor trace on a mount for an electronic device, wherein the signal conductor trace on the mount is flanked on both edges by grounded conductor traces.

13. The header of claim 1, further comprising a second pedestal, wherein the pedestal and the second pedestal each carry one of the two submounts, and wherein the pedestal and the second pedestal have a mirror symmetry.

14. An electronic component, comprising:
a header having a base, a first feedthrough pin, a second feedthrough pin, a pedestal, and two submounts, the base has a first electrical feedthrough and a second electrical feedthrough, wherein the first and second feedthrough pins extend through the base at the first and second electrical feedthroughs, respectively, and are electrically isolated to the base within the first and second electrical feedthroughs, respectively, wherein the pedestal connected to the base, and wherein the two submounts each comprising a carrier with a structured conductor plating, the structured conductor plating comprising at least two conductor traces, with one of the at least two conductor traces of each of the two submounts being electrically connected to one of the first and second feedthrough pins, wherein the two submounts have an identical structure but are mounted onto the pedestal so that a first submount is flipped with respect to a second submount, the structured conductor plating has a pattern that is a mirror symmetrical with respect to a symmetry plane, and the symmetry plane is located between two opposite ends of each of the two submounts;
an electronic device on the header;
a housing enclosing the electronic device and the header; and
a cap attached to the header so that a cavity is provided with the electronic device arranged within the cavity.

15. The electronic component of claim 14, wherein the electronic device is an optoelectronic device for sending or receiving optical signals and wherein the housing comprises a transparent member to transmit the optical signals into or out of the housing.

16. A header for an electronic component, comprising:
a base having a first electrical feedthrough and a second electrical feedthrough;
a first feedthrough pin in the first electrical feedthrough;
a second feedthrough pin in the second electrical feedthrough, wherein the first and second feedthrough pins extend through the base and are electrically isolated to the base within the first and second electrical feedthroughs, respectively;
a pedestal connected to the base;
two submounts each comprising a carrier with a structured conductor plating, the structured conductor plating comprising at least two conductor traces, with one of the at least two conductor traces of each of the two submounts being electrically connected to one of the first and second feedthrough pins; and
a feature selected from a group consisting of: a further conductor trace arranged between limbs of a U-shaped conductor trace; a further conductor trace arranged between a limb of a U-shaped conductor trace and an end of one of the two submounts proximal to the limb; a widened end a conductor trace of the two submounts that is distal to an end connected to the first and second feedthrough pins, respectively; a device submount for mounting the electronic device; and a head of the first and second feedthrough pins, respectively, is formed and positioned so as to reduce a distance of the feedthrough pins to the conductor plating,
wherein the two submounts are equally formed but mounted in different orientations.

* * * * *